United States Patent

[11] 3,579,056

[72] Inventors Ties Siebolt TeVelde; Albert Schmitz, Emmasingel, Eindhoven, Netherlands
[21] Appl. No. 767,062
[22] Filed Oct. 10, 1968
[45] Patented May 18, 1971
[73] Assignee U.S. Philips Corporation New York, N.Y.
[32] Priority Oct. 21, 1967
[33] Netherlands
[31] 6714336

[54] SEMICONDUCTOR CIRCUIT HAVING ACTIVE DEVICES EMBEDDED IN FLEXIBLE SHEET
8 Claims, 9 Drawing Figs.

[52] U.S. Cl. .......... 317/234, 317/235, 317/101
[51] Int. Cl. .......... H01l 15/00
[50] Field of Search .......... 317/234–81, 235/27, 235/22, 101 (CP)

[56] References Cited

UNITED STATES PATENTS

| | | | |
|---|---|---|---|
| 3,121,177 | 2/1964 | Davis | 307/88.5 |
| 3,483,038 | 12/1969 | Hui et al. | 136/89 |
| 3,411,050 | 11/1968 | Middleton et al. | 317/234 |
| 3,040,416 | 6/1962 | Matlow et al. | 29/155.5 |
| 3,402,331 | 9/1968 | Rittner | 317/235 |
| 3,466,741 | 9/1969 | Wiesner | 29/588 |
| 3,433,677 | 3/1969 | Robinson | 136/89 |

*Primary Examiner*—James D. Kallam
*Assistant Examiner*—Martin H. Edlow
*Attorney*—Frank R. Trifari

ABSTRACT: A semiconductor device is described comprising a flexible sheet assembly of separate semiconductor components embedded in an electrically insulating flexible sheet. The contact surfaces of the semiconductor components are exposed. Interconnections may be made between the components by providing metal strips on one or both outer surfaces of the flexible sheet assembly, the connections lying on the outer surface of the intervening sheet material.

Figures 1, 2:
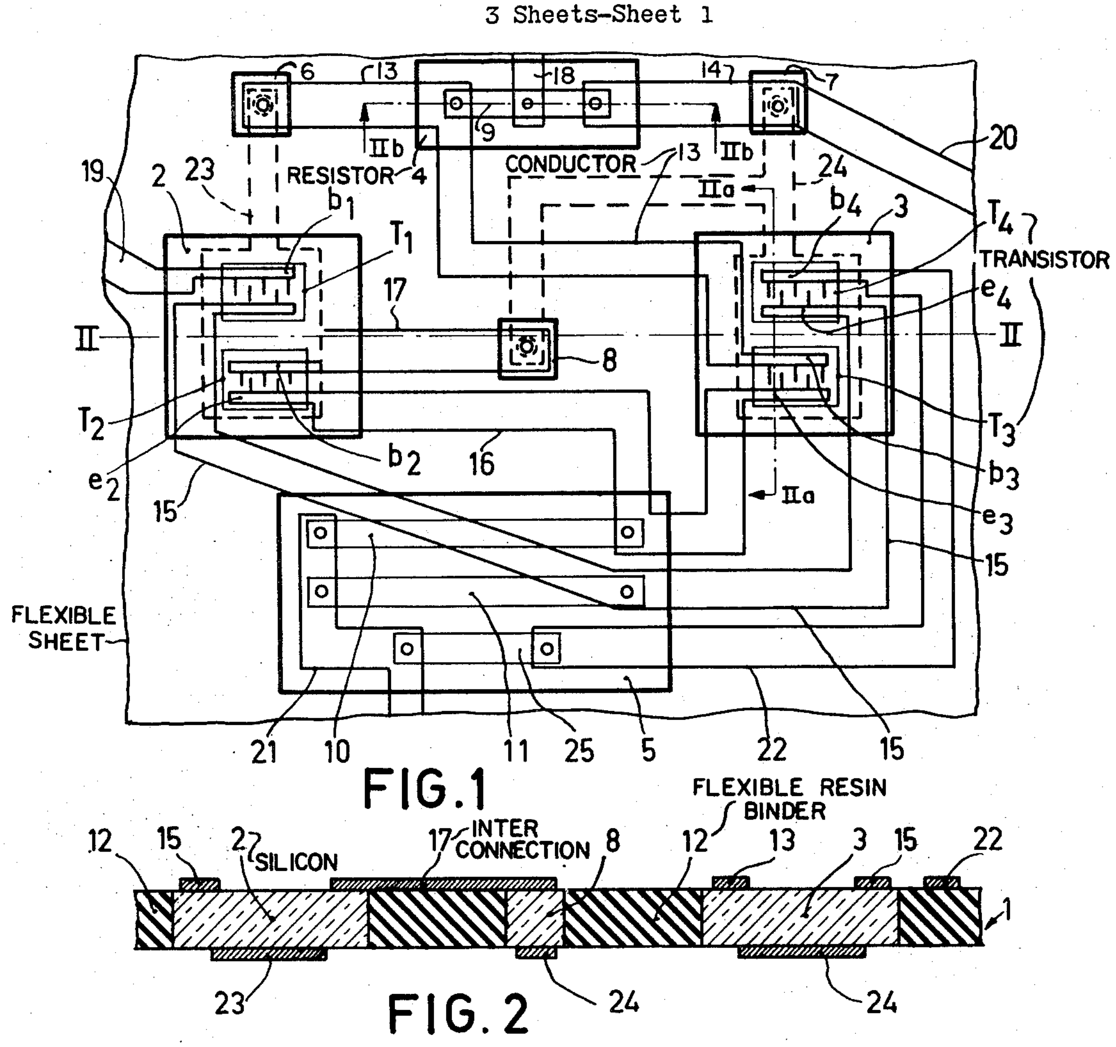

INVENTOR.
TIES S. Te VELDE
ALBERT SCHMITZ
BY
AGENT

TIES S. Te VELDE
ALBERT SCHMITZ
INVENTOR.
BY
Frank R. Trifari
AGENT

INVENTOR.
TIES S. Te VELDE
ALBERT SCHMITZ
BY
Frank R Trifari
AGENT

SEMICONDUCTOR CIRCUIT HAVING ACTIVE DEVICES EMBEDDED IN FLEXIBLE SHEET

The invention relates to a semiconductor device comprising a layer having a number of semiconductor components which are separated from one another by an electrically insulating material and are connected together on at least one side of the layer by mutually separated conductors which are located at least partly on the insulating material and adjoin surface parts of the components which are free from the insulating material.

The invention also relates to a method of manufacturing such a semiconductor device.

Semiconductor components are to be understood to mean herein semiconductor bodies which may comprise one or several active or passive circuit elements, for example, diodes, transistors, multilayer structures, resistors and capacitances, which may or may not be sensitive to radiation or emit radiation and by means of which a semiconductor circuit can be constructed by connecting together the components in the desired manner by means of conductors.

Semiconductor devices of the type described consist in various constructions. They are used advantageously inter alia upon integration of those circuits in which a very high breakdown voltage is necessary between the components mutually, and for which, for example, monolithic circuits having island insulation by means of PN junctions cannot be used. The devices described are also advantageously used in those cases in which a minimum capacitance is endeavored and in which, for example, the capacitance of a PN island insulation is disturbing.

Known is a construction in which semiconductor components are provided on a ceramic substrate and mutually adjoin, through soldering places, metallic connections provided on the substrate. This construction is used inter alia in so-called hybrid circuits.

In another known construction semiconductor plates having an integrated circuit are provided in a ceramic material after which they are connected together electrically by means of metal layers provided on the ceramic material.

In the above known structures, a very good electric insulation between the separate components is obtained, while avoiding island-substrate capacitances. However, these constructions have a few important drawbacks. Both mentioned structures are mechanically rigid and therefore breakable. Moreover, as a result of this and also as a result of the difference in coefficient of expansion between the semiconductor material and the ceramic insulation material, the various parts of the semiconductor device are subject to stresses when temperature variations occur. This applies in particular, for example, to soldering places between the semiconductor components and the metal tracks provided on the insulation material, as they occur in hybrid circuits. Such soldering places are usually carried out in the form of solder bumps which can easily break off due to the said thermal stresses occurring in known rigid constructions.

Furthermore, the said known constructions have the drawback that the semiconductor components in question can generally be contacted only on one side of the ceramic insulation layer so that the conductor pattern which connects the components together becomes complicated and often comprises many intersections which cannot easily be made.

It is the object of the invention to provide a semiconductor device of the type described which can be manufactured in a simple manner and in which the said drawbacks associated with known constructions are avoided or are at least mitigated considerably.

A semiconductor device of the type mentioned in the preamble is therefore characterized according to the invention in that the components are embedded in, and mechanically cohere together by, an electrically insulating flexible binder and constitute therewith a flexible sheet.

The invention is based inter alia on the recognition of the fact that by embedding the semiconductor components in a flexible electrically insulating binder the device becomes considerably less breakable while also stresses occurring due to temperature variations are avoided or are mitigated at least considerably.

The invention is furthermore based on the recognition of the fact that when using a flexible binder the semiconductor device in question can simply be given the form of a flexible sheet in which the semiconductor components provided in the sheet can be contacted, if desired, on both sides of the sheet so that by piling up several of these stratified constructions, three-dimensional integrations can simply be obtained of components which may each contain in addition one or more integrated circuits.

An important advantage of a device according to the invention is further that such devices may have a comparatively very large active surface and are very suitable for series manufacture while in general they can easily be handled and mounted.

A structure is used with particular advantage in which at least part of the components on either side of the sheet are free from the binder and are connected together electrically by means of metal strips located partly on the insulating binder. As a result of this the number of intersecting connections in the circuit can be strongly restricted while in addition semiconductor components can be used which have to be contacted on either side at one or more places. As metal strips metal layers deposited from the vapor phase may be used, for example, vapor-deposited aluminum layers which, due to their low thickness, do not break or work loose upon bending of the flexible sheet. As already noted above, this preferred embodiment is particularly suitable for use in three-dimensional integrations by connecting several sheets in series, each sheet having, for example, a different function in the circuit. In a further preferred embodiment according to the invention therefore at least two of the said stratified structures are located one on the other over at least part of their surface, with or without the interposition of an electrically insulating layer so as to avoid electric contact between the layers at undesired places, and a conductor on one layer is connected electrically, on one of the sides of the layers facing one another, to a conductor on the oppositely located side on the other layer.

The invention is of particular importance in the case in which at least one component is formed by a semiconductor body which contains at least one semiconductor circuit element with planar structure. In this case the thickness of the flexible binder may advantageously also be chosen to be so that a surface of a component substantially coincides with the surface of the binder so that a fully planar two-dimensional integration is obtained. This preferred embodiment is of particular advantage in those cases in which one or more components contain a planar integrated circuit. In this case, by using the invention, a very simple and practical planar integration of integrated circuits is obtained ("large scale integration").

The invention is furthermore of particular importance in those cases in which semiconductor grains are used as components instead of or together with monocrystalline semiconductor plates which contain one or more circuit elements and are brought into a suitable form by mechanical and chemical treatments. For example, cadmium sulfide grains may be used which, in combination with suitably chosen and provided electrodes, can constitute a photoresistor or a solar cell.

Together with other components which are or are not manufactured by means of semiconductor grains, such an element may form part of a device according to the invention as a component of a circuit. Of particular importance is the case in which a circuit element, for example, a diode, a capacitance, a photodetector or a recombination light source, is formed in one or more semiconductor grains. By providing such grains or groups thereof according to the invention in a flexible binder and connecting them together by means of conducting metal strips, integration on a large scale of very small elements can be obtained in an efficacious and simple manner.

As regards the material of the flexible binder, those skilled in the art may make a choice of many possibilities. The extent of flexibility of the resulting sheet may be adapted to the anticipated use. As binders are to be considered both flexible and less flexible materials in which in the latter case the extent of flexibility of the resulting device will mainly be determined by the thickness of the binder. As examples may be mentioned polyethylene, polyvinyl chloride and other synthetic materials or types of rubber. In connection with a particularly simple method of manufacturing a device according to the invention, which will be described below, polyurethane may be mentioned as a binder. Polyurethane, which is a resin containing the group $$-NH-\underset{\underset{O}{\|}}{C}-O-$$

is part of the polyester class of resins, which also include synthetic resins having the groups $$-\underset{\underset{O}{\|}}{C}-O-$$

or $$-O-\underset{\underset{O}{\|}}{C}-O-$$

This class of resins offers the advantages that they are readily saponified (selective removed) by aqueous or alcoholic lye solutions of NaOH or KOH in the range of about 1—10 percent by weight, which as such is well known in the art.

The device according to the invention can be manufactured in a variety of manners. For example, according to a known method the components are embedded in polyethylene between rubber dies between which the components are clamped after which, after hardening of the polyethylene, the rubber dies are removed and a flexible sheet is obtained supporting components of which parts of the surface are free. The required metal strips may then be provided on said sheet by vapor-deposition and etching. The rubber die method is described in more detail in U.S. Pat. No. 3,210,831.

Besides from separate components the device may alternatively be manufactured starting from components which form part of one and the same semiconductor plate. This plate is provided, for example, on a support and etched in such manner that between the components the semiconductor material is removed entirely, after which the binder is provided between the elements and the support is removed. The components, at least on the side of the support, are free from the binder and the layers may be provided with a vapour-deposited pattern of conductors.

According to the invention, a particularly practical method of manufacturing a device comprising a layer having a number of semiconductor components which are separated from each other by an electrically insulating material and are interconnected electrically at least on one side of the layer by mutually separated conductors, which are located at least partly on the insulating material and which adjoin surface parts of the components which are free from the insulation material, is characterized in that the semiconductor components are provided on a support after which a layer of polyurethane is provided between and across the components, said layer is then removed for part of its thickness by saponification so that surface parts of at least a part of the component are made free and that the support is removed after which the conductors are provided.

The invention furthermore relates to a device manufactured by using said method.

Figure 2A:
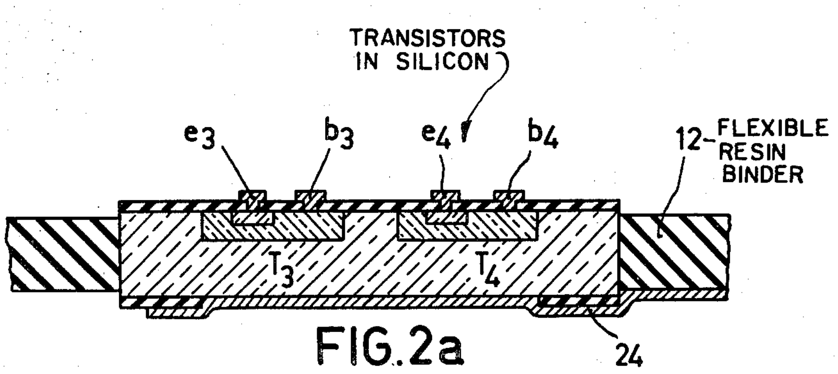
Figure 2B:
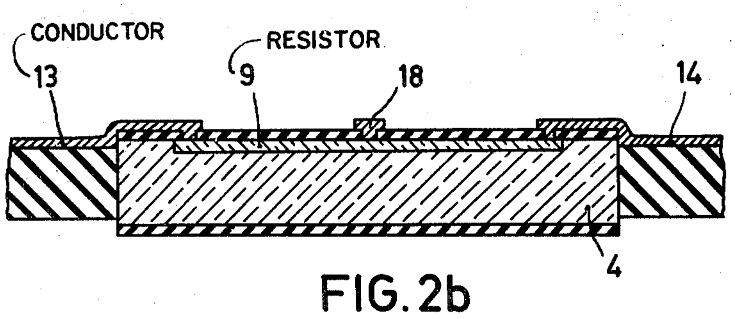

In order that the invention may be readily carried into effect, a few examples thereof will now be described in greater detail, by way of example, with reference to the accompanying drawings, in which:

FIG. 1 is a plan view of a part of a semiconductor device according to the invention, FIG. 2, 2*a* and 2*b* are diagrammatic cross-sectional views taken on the lines II–II, II*a*–II*a*, and II*b*–II*b*, respectively, of FIG. 1.

Figure 3:
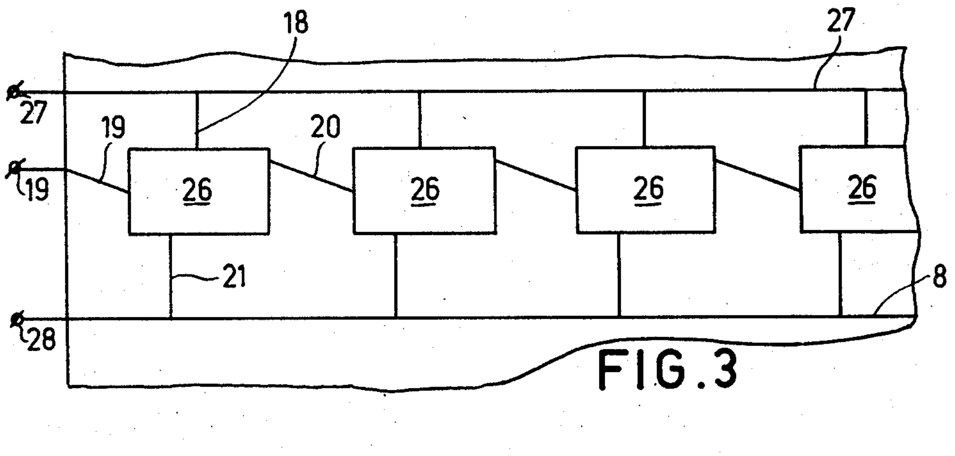
Figures 4, 5, 6, 7:
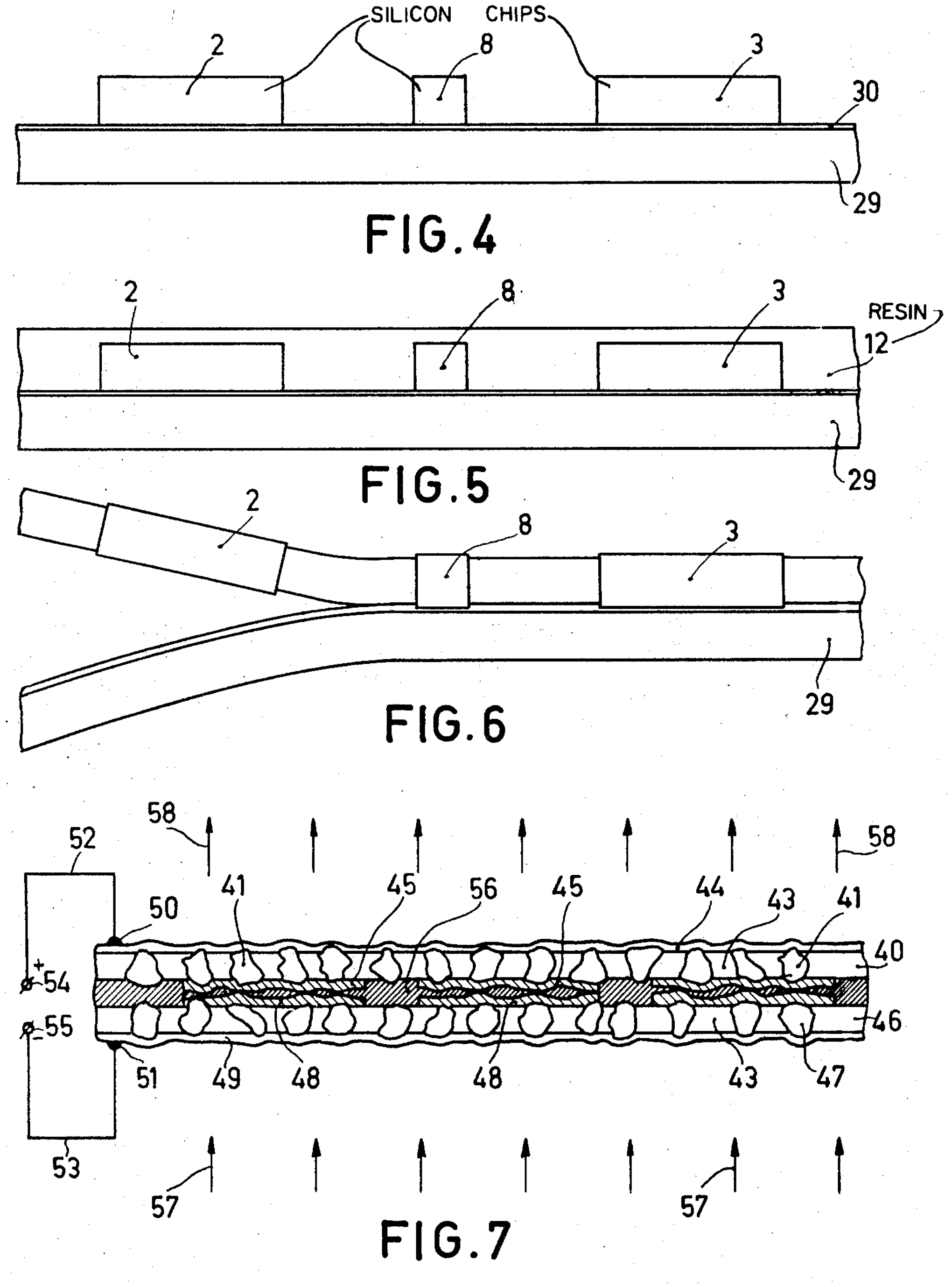

FIG. 3 is a diagrammatic plan view of a semiconductor device according to the invention, built up from parts as shown in FIGS. 1 and 2, FIGS. 4 to 6 are diagrammatic cross-sectional views taken on the line II–II of a part of the device shown in FIGS. 1 to 3 in successive stages of manufacture, and FIG. 7 is a diagrammatic cross-sectional view of another semiconductor device according to the invention.

FIGS. 1 and 3 diagrammatically show a plan view and FIGS. 2, 2*a* and 2*b* cross-sectional views taken on the lines II–II, II*a*–II, and II*b*–II*b*, respectively, of FIG. 1, of a semiconductor device according to the invention. The device (see FIGS. 1 and 2) comprises a layer 1 having semiconductor components 2 to 8 which consist of monocrystalline silicon plates. In each of the plates 2 and 3 two high-frequency transistors ($T_1$ to $T_4$) are provided with emitters $e_1$ to $e_4$ and bases $b_1$ to $b_4$. A diffused resister 9 with center tap is provided in the plate 4 and diffused resistors 10, 11 and 25 are provided in the plate 5 by means of methods commonly used in semiconductor technology. All these circuit elements constitute generally conventional planar structures, which may be manufactured by standard planar techniques including photolithographic techniques and selective diffusion through oxide masks. In this example the transistors are of the NPN type, the resistances comprise rectangular N-type surface zones which are diffused in P-type semiconductor chips, typical structures of which are illustrated in FIGS. 2*a* and 2*b*.

The components 2 to 8 are separated from each other by an electrically insulating material 12 and are interconnected electrically on either side of the layer by the mutually separated conductors 13 to 24 which are constituted by vapor-deposited aluminum strips and the strips 13 to 22 of which are provided on the upper side of the layer and the strips 23 and 24 are provided on the lower side of the layer. Conductive connections on the lower side are shown in broken lines in the FIGS. These strips are located between the components on the insulation material 12 and adjoin surface parts of the components 2 to 8 which are free from the insulation material through the contact plates shown diagrammatically by small circles. The plates 6, 7 and 8 consist of a semiconductor material which is strongly conductive at least at the surface and serve for the connection between metal strips located on either side of the layer 1. Of course, a metal may alternatively be used for these plates.

According to the invention, the insulation material 12 consists of an electrically insulating flexible binder, in this example of a polyurethane, the surface of which substantially coincides with the surface of the plates 2 to 8 and by means of which the components 2 to 8 cohere together mechanically so that the assembly of binder and components constitutes a flexible sheet 1. As a result of this the above-mentioned advantages are obtained, Of particular advantage in this example is that the collector connection of the transistors $T_1$ to $T_4$ is provided on the lower side of the sheet through the metal strips 23 and 24 (see FIGS. 1 and 2). As compared with conventional monolithic circuits, in which generally all the contacts are provided on one side, the possibility is created of using components having very small transistors for very high frequencies, in which in addition the frequency restriction is avoided which occurs in known structures by island insulation through PN junctions with the capacitances connected thereto.

The circuit arrangement shown in FIGS. 1 and 2 constitutes a bistable circuit element (flip-flop) having an input 19, an output 20 and supply lines 18 and 21. This circuit may be repeated and composed according to the invention in the manner shown diagrammatically in FIG. 3 to a shift register in the form of a flexible sheet. The rectangles 26 each represent a flip-flop as shown in FIGS. 1 and 2, while the output 20 of each bistable element 26 is connected to the input 19 of the next bistable element and the connections 18 and 21 are connected to the supply lines 27 and 28 which are again in the form of metal layers provided on the sheet.

The device shown in FIGS. 1, 2 and 3 may be manufactured according to the invention in the following manner (see FIGS. 4 to 6). On a support 29, which preferably is flexible and is coated with an adhesive layer 30, for example, a gelatin layer, the various semiconductor components are adhered (see FIG. 4). A layer 12 of polyurethane is then provided between and across the components, for example, by means of a roller (see FIG. 5). For this purpose may be used, for example, the commercially available liquids known by the names of "desmopheen 1200" and "desmodur L," which are to be mixed to prepare polyurethane, if required while adding ethyl acetate to reduce the viscosity. The mixing ratio used is: 45 gms. of "desmopheen 1200," 65 gms. of "desmodur L" and 45 gms. of ethyl acetate. "Desmopheen 1200" contains a saturated polyester obtained by polycondensation of adipinic acid, trihydroxypropane and butyleneglycol. "Desmodur L" contains the addition product of 2,2-dioxymethylbutanol-1 with a mixture of 2,4-toluenedi-isocyanate and 2,6-toluenediisocyanate (65:35). After providing the mixture it is exposed to the air for 15 minutes after which the assembly is heated at approximately 75° C. for 5 hours. The hardened layer 12 is formed by polycondensation of the raw materials used.

The layer 12 is then contacted, on the side remote from the support, with an alcoholic lye solution (5 percent of KOH in ethanol), as a result of which the polyurethane is removed by saponification until the components are just free from the polyurethane at their surface, after which the saponification is discontinued. The polyurethane layer 12 with components is detached from the support, for example, by stripping (see FIG. 6) or by dissolving the layer of adhesive 30.

Aluminum is then vapor-deposited on either side of the resulting layer after which by using the photolithographic methods commonly used in semiconductor technology, the desired pattern of conductors is formed and the construction of FIG. 2 is obtained.

The second example to be described is a light intensification unit consisting of a series arrangement of two juxtaposed layers both constituted by a monograin layer of semiconductor grains, the first layer of which contains electroluminescent semiconductor components and the second layer contains photoconductive components.

FIG. 7 diagrammatically shows a cross-sectional view of a device comprising a layer 40 which is built up from electroluminescent grains 41 of activated zinc sulfide (composition in at. % : ZnS approximately 98 percent, MnS approximately 2 percent, Cu and C1 approximately 0.1 percent), which are embedded in a binder 43 of polyurethane according to the method described above.

The layer 40 is coated on the upper side with the contact layer 44 of gold with approximately 2 percent indium, thickness 500 A., which is permeable to the fluorescence radiation emitted by the grains 41 and constitutes a substantially ohmic contact with the grains 41. On its other side the layer 40 is coated with contact layers 45 which are not permeable to radiation and are in the form of islands, for example, of vapor-deposited copper, which constitute a rectifying contact with the grains 41.

The layer 40 is located on a second layer 46 consisting of photoconductive grains 47 of cadmium sulfide, likewise embedded in polyurethane as a binder. On the side of the layer 40, contact layers 48 of indium in the form of islands are provided on the layer 46 and make a substantially ohmic contact with the cadmium sulfide grains 47 and are not permeable within the range of radiation within which the device is operative. On the other side of the layer 46 a contact layer 49 of gold +2 percent indium which is permeable to incident radiation is provided, thickness approximately 500 A., which also makes an ohmic contact with the grains 47.

The contact layers 45 on the layer 40 are located opposite to the contact layers 48 on the layer 46 and make an electric contact with them at one or more points. The contact layers 44 and 49 are directly connected to the connection terminals 54 and 55 by contacts 50 and 51 through the conductors 52 and 53. The remaining spaces between the layers 40 and 46 are filled with an electrically insulating 56 of lacquer which is not permeable to the radiation used and also serves as an adhesive layer between the layers 40 and 46.

When a direct voltage is applied between the terminals 54 and 55, for example, a positive voltage of 80 volt at the terminal 54 with respect to the terminal 55, the whole voltage is substantially set up across the photoconductive layer 46 when no radiation is incident on the device. If, however radiation is incident on the layer 46 through the radiation-permeable contact layer 49 in the direction of the arrows 57, the resistance of the layer 46 between the contact layers 48 and 49 is strongly reduced and substantially the whole voltage is set up across the electroluminescent layer 40. The grains 41 then emit fluorescent radiation which leaves the device in the direction of the arrows 58 through the radiation-permeable contact layer 44.

By choosing the radiation sensitivity and voltage sensitivity, respectively, of the layers 46 and 40 in the correct manner, which will be no problem to those skilled in the art, intensification of the radiation 58 with respect to the radiation 57 may be obtained and/or a conversion of radiation 57 with a given spectral distribution into radiation 58 with another spectral distribution may be obtained. If the intensity of the incident radiation 57 is not divided homogeneously over the layer 46, only those parts of the layer 40 which are located opposite to sufficiently radiated parts of the layer 46 will emit radiation. The parts of the layer 40 covered by the islands 45 and the parts of the layer 46 covered by the islands 48 constitute semiconductor components in the sense of the invention, the contacted grains 41 each constituting a diode.

It will be obvious that the invention is not restricted to the examples described and that many variations are possible to those skilled in the art without departing from the scope of this invention. For example, in a device as shown in FIGS. 1 to 3, the components 2 and 3 may comprise, besides on the upper side, several semiconductor regions to be contacted also on the lower side, while in addition a device constituted by several piled layers may comprise an electrically insulating layer between successive layers, outside of the contact plates between said layers mutually. Furthermore other materials may be used, for example, semiconductor materials having a conductivity type differing from that described in the examples.

We claim:

1. A semiconductor device comprising a flexible sheet of electrically insulating flexible binder material, a plurality of spaced separated rigid semiconductor components embedded in said binder material and joined together by the intervening binder material to form a unitary flexible sheet assembly, each of said semiconductive components being mounted in the plane of the sheet and having on at least one of its surfaces electrical contacts which are exposed and free of the insulating binder material, and interconnections for said semiconductor components, said interconnections comprising separate conductors which are mounted on the outer surface of the sheet assembly and extend to and between exposed contacts of the separated components and on and over the outer surface of the intervening binder material.

2. A device as set forth in claim 1 wherein the surface opposite to said one surface of part of the components also has exposed contacts which are free from the binder, and the interconnections include metal strips on the opposite outer surface of the sheet assembly which extend to and between exposed contacts of separate components and on and over the outer surface of the intervening binder material.

3. A device as set forth in claim 1 wherein the components are arranged in plural layers in the plane of the sheet, interconnections on one layer of components being in contact with interconnections on another layer of components.

4. A device as set forth in claim 1 wherein at least one component is a semiconductor body containing at least one planar semiconductor circuit element.

5. A device as set forth in claim 4 wherein said one component comprises a planer integrated circuit.

6. A device as set forth in claim 4 wherein said one component has a surface coinciding substantially with the surface of the binder.

7. A device as set forth in claim 1 wherein the binder is polyurethane.

8. A device as set forth in claim 1 wherein at least one of the components contains semiconductive grains.